(12) United States Patent
Sasaki

(10) Patent No.: US 12,231,096 B2
(45) Date of Patent: Feb. 18, 2025

(54) ERROR AMPLIFIER CIRCUIT

(71) Applicant: WILL SEMICONDUCTOR (SHANGHAI) CO. LTD., Shanghai (CN)

(72) Inventor: Hiroaki Sasaki, Miyagi (JP)

(73) Assignee: WILL SEMICONDUCTOR (SHANGHAI) CO. LTD., Shanghai (CN)

( * ) Notice: Subject to any disclaimer, the term of this patent is extended or adjusted under 35 U.S.C. 154(b) by 416 days.

(21) Appl. No.: 17/878,456

(22) Filed: Aug. 1, 2022

(65) Prior Publication Data

US 2023/0421115 A1 Dec. 28, 2023

(30) Foreign Application Priority Data

Jun. 24, 2022 (CN) .......................... 202210728588.7

(51) Int. Cl.
*H03F 3/04* (2006.01)
*H03F 3/45* (2006.01)

(52) U.S. Cl.
CPC ......... *H03F 3/04* (2013.01); *H03F 2200/129* (2013.01)

(58) Field of Classification Search
CPC ................. H03F 3/04; H03F 2200/129; H03F 2200/144; H03F 2200/351; H03F 3/183; H03F 3/2171; H03F 3/45475; H03F 1/34; H02M 1/0003; H02M 1/0016; H02M 1/08; H02M 1/088; H02M 3/158; H03H 11/34
USPC .................................. 330/291, 10, 252–261
See application file for complete search history.

(56) References Cited

U.S. PATENT DOCUMENTS

| | | | |
|---|---|---|---|
| 10,250,128 B2 | 4/2019 | Unno et al. | |
| 11,172,556 B2 * | 11/2021 | Aoki | ...................... H05B 45/14 |
| 11,349,391 B1 * | 5/2022 | Mercer | ............... H02M 3/1584 |

* cited by examiner

*Primary Examiner* — Hieu P Nguyen
(74) *Attorney, Agent, or Firm* — MUNCY, GEISSLER, OLDS & LOWE, P.C.

(57) ABSTRACT

An error amplifier circuit includes: a plurality of error amplifiers, each of which obtains an output for an error between two input signals; and a multiplexer, which selects or deselects the outputs of the plurality of error amplifiers and outputs the selected output of the error amplifier as a control signal for a circuit to be controlled. Regarding the multiplexer, in an error amplifier which is one of the plurality of error amplifiers and of which the output is not selected, a delay element arranged in an input path of the one error amplifier is short-circuited to widen the bandwidth of the error amplifier.

5 Claims, 4 Drawing Sheets

ERROR AMPLIFIER CIRCUIT

BACKGROUND OF THE INVENTION

1. Field of the Invention

The disclosure relates to an error amplifier circuit including a plurality of error amplifiers.

2. Description of the Related Art

Conventionally, feedback control has been widely used as a control method. For example, in a regulator that outputs a predetermined power supply voltage, the output voltage is subjected to the feedback control.

Here, in a case that the feedback control is performed, an error amplifier that compares a set voltage with a detection voltage is often used, and when there are a plurality of set values, one of the outputs of the plurality of error amplifiers is selected to allow the regulator to be subjected to the feedback control. A multiplexer, for example, is used for this selection.

As for an error amplifier that is not selected, the output is not fed back, and thus the output is turned at an upper limit or a lower limit.

Moreover, in the feedback control using the error amplifier, a phase compensation circuit including resistors and capacitors is arranged in order to prevent the error amplifier from oscillating.

Accordingly, in a case that one error amplifier enters a selected state from an unselected state, a transition is made from a state where the output is turned at the upper limit or the lower limit to a target state, but due to the phase compensation circuit, there are problems that the change thereof is slow, so it takes time to enter the target state, and in addition, an overshoot, an undershoot, or the like occurs during this period.

SUMMARY OF THE INVENTION

Means to Solve the Problems

An error amplifier circuit according to the disclosure includes:
- a plurality of error amplifiers, each of which obtains an output for an error between two input signals; and
- a multiplexer, which selects or deselects the outputs of the plurality of error amplifiers and outputs the selected output of the error amplifier as a control signal for a circuit to be controlled;
wherein
regarding the multiplexer, in an error amplifier which is one of the plurality of error amplifiers and of which the output is not selected, a delay element arranged in an input path of the one error amplifier is short-circuited to widen the bandwidth of the error amplifier.

According to the disclosure, the time required for reaching a target value can be reduced by a relatively simple circuit.

PREFERRED EMBODIMENT OF THE PRESENT INVENTION

Hereinafter, an embodiment of the disclosure is described below with reference to the drawings. It should be noted that the following embodiment is not intended to limit the disclosure, and in addition, a configuration obtained by selectively combining a plurality of examples is also included in the disclosure.

Overall Configuration

Figure 1:
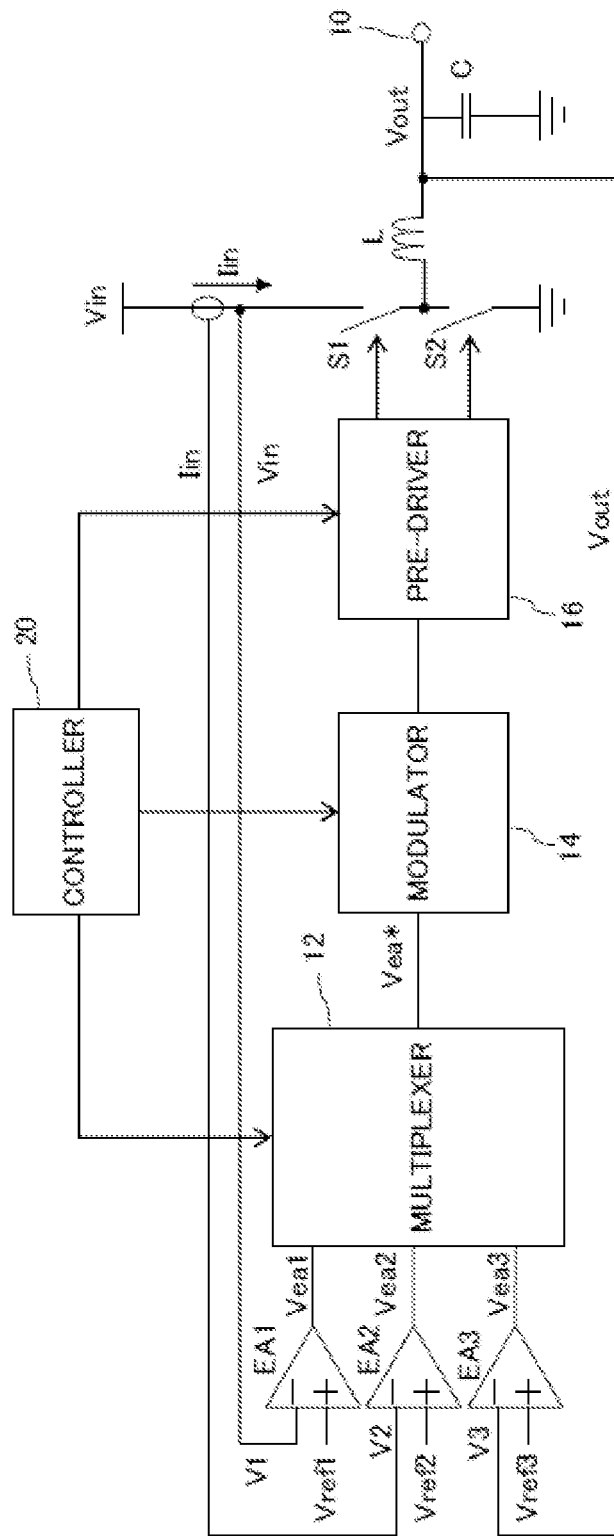
FIG. 1 is a diagram showing the configuration of an error amplifier circuit according to an embodiment of the present invention.

FIG. 1 is a diagram showing the configuration of an error amplifier circuit according to an embodiment of the present invention. A power supply Vin is connected to ground via a pair of switches S1 and S2. A connection point between the switches S1 and S2 is connected to an output end 10 via a coil L, and a voltage Vout is output therefrom. In addition, one end of a capacitor C is connected to the output end, and the other end of the capacitor C is connected to ground. The switches S1 and S2 are composed of MOSFETs, for example. Note that the output voltage Vout is used as a power supply of a load or the like.

The switches S1 and S2, the coil L, and the capacitor C constitute a DC-DC converter, and by alternately turning the switches S1 and S2 on and off at an appropriate duty ratio, a desired output voltage Vout can be obtained at the output end 10. Note that in the embodiment, the DC-DC converter is a circuit to be controlled.

The voltage of the power supply Vin is Vin, which is input to the negative input end of an error amplifier EA1. The input signal is referred to as a detection signal V1, and the V1 corresponds to the Vin. A reference value Vref1 for a reference value voltage is input to the positive input end of the error amplifier EA1, and an output signal Vea1 corresponding to the difference between the two inputs is output.

The current Iin from the power supply Vin is input to the negative input end of an error amplifier EA2. The input signal is referred to as a detection signal V2, and the V2 corresponds to the Iin. A reference value Vref2 for a reference current is input to the positive input end of the error amplifier EA2, and an output signal Vea2 corresponding to the difference between the two inputs is output.

The output voltage Vout is input to the negative input end of an error amplifier EA3. The input signal is referred to as a detection signal V3, and the V3 corresponds to the Vout. A reference value Vref3 for a reference output voltage is input to the positive input end of the error amplifier EA3, and an output signal Vea3 corresponding to the difference between the two inputs is output.

Note that it is sufficient that the V1 and the Vin, and the V2 and the Iin, as well as the V3 and the Vout correspond to each other respectively, there may be a case of V1=Vin, V2=Iin, and V3=Vout, and there may be a case that one of the V1 and the Vin is set to a fraction of the other, one of the V2 and the Iin is set to a fraction of the other, and one of the V3 and the Vout is set to a fraction of the other.

Then, the output signals Vea1 to Vea3 are input to a multiplexer 12, and one of these signals is selected. The signal selected by the multiplexer 12 is input to a modulator 14. The modulator 14 generates a PWM modulation signal from an output signal Vea* selected from the output signals Vea1 to Vea3. Note that the signal Vea* is referred to as a control signal. The obtained PWM modulation signal is input to a pre-driver 16, and is converted into on-off signals of the switches S1 and S2 in the pre-driver 16. Note that although an analog multiplexer using an analog switch or the like can be employed as the multiplexer 12, the multiplexer 12 may have any configuration as long as a signal can be selected.

In this way, the on-off signals of the switches S1 and S2 are controlled according to the output signal Vea* selected from the output signals Vea1 to Vea3. Accordingly, in a case that the output signal Vea1 has been selected, the switching is controlled so that the voltage Vin matches the reference value Vref1, in a case that the output signal Vea2 has been selected, the switching is controlled so that the current Iin matches the reference value Vref2, and in a case that the output signal Vea3 has been selected, the switching is controlled so that the voltage Vout matches the reference value Vref3.

Note that a controller 20 controls which signal will be selected in the multiplexer 12, and controls at what duty ratio the switches S1 and S2 will be turned on and off, and the like. For example, a method such as selecting the one having the lowest value from the output signals Vea1 to Vea3, or the like can be employed. Moreover, although three error amplifiers EA1 to EA3 are arranged in this example, the number may be two, or four or more as long as a plurality of error amplifiers are included.

"Short-Circuiting of Delay Element"

Figure 2A:
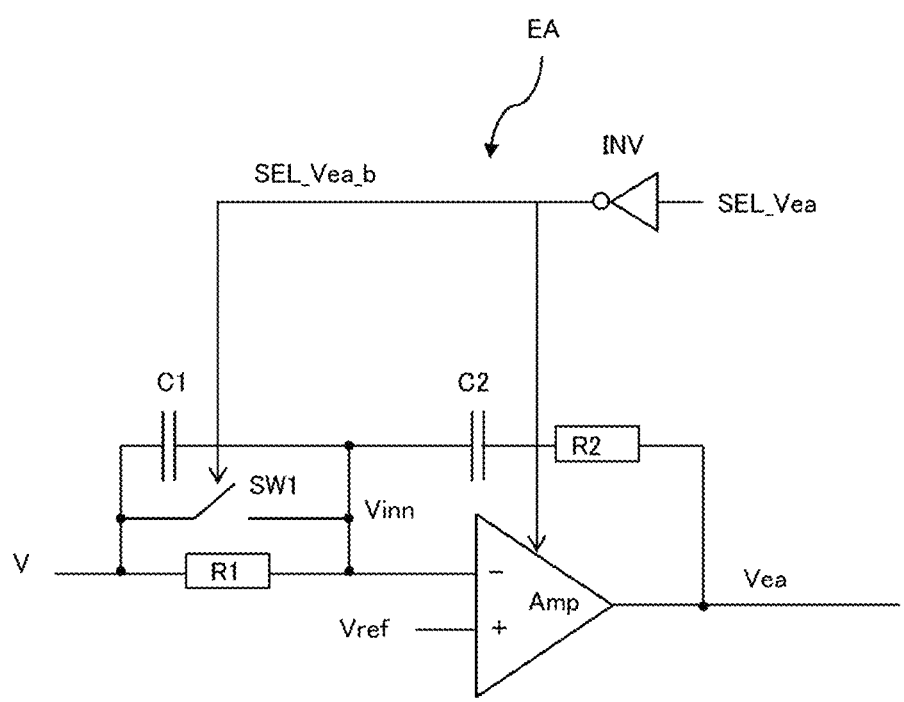
FIG. 2A is a diagram showing the configuration of an error amplifier EA (EA1 to EA3).
Figure 2B:
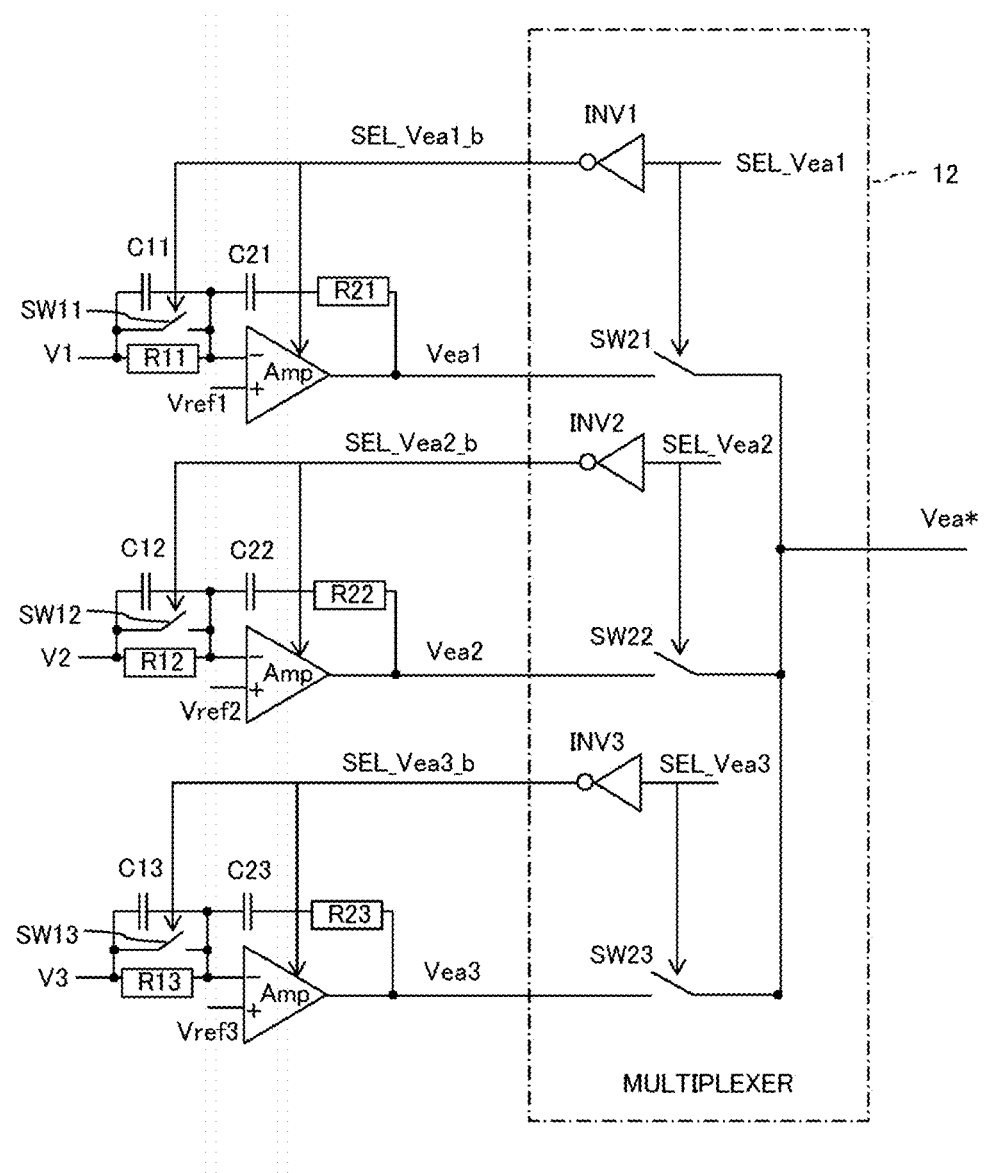
FIG. 2B is a diagram showing the detailed configurations of three error amplifiers EA1 to EA3 and a multiplexer 12.

FIG. 2A is a diagram showing the configuration of an error amplifier EA (EA1, EA2, and EA3). Here, the error amplifier EA represents the three error amplifiers EA1, EA2, and EA3 shown in FIG. 2B. Note that although the three error amplifiers EA1, EA2, and EA3 are shown in FIG. 2B, four or more error amplifiers may be arranged corresponding to four or more detection signals.

In the error amplifier EA, the detection signal V (V1, V2, and V3) in the circuit to be controlled is input to the negative input end of an amplifier Amp (Amp1, Amp2, and Amp3) inside the error amplifier EA. In this example, V1=Vin, V2=Iin, and V3=Vout.

A resistor R1 (R11, R12, and R13) is arranged in an input path to the negative input end of the amplifier Amp. This resistor R1 functions as a delay element for signal changes in order to limit a current flowing in the input path to the negative input end. In addition, a capacitor C1 (C11, C12, and C13) is connected in parallel with the resistor R1.

Besides, a switch SW1 (SW11, SW12, and SW13) is arranged in parallel with the resistor R1 and the capacitor C1. Accordingly, by turning the switch SW1 on, two ends of the resistor R1 and two ends of the capacitor C1 are short-circuited, and the detection signal V is directly input to the negative input end of the amplifier Amp without going via the resistor R1 and the capacitor C1. In addition, a serial connection of a capacitor C2 (C21, C22, and C23) and a resistor R2 (R21, R22, and R23) is arranged between the negative input end and the output end of the amplifier Amp (a negative feedback path).

An inverted selection signal SEL_Vea_b is supplied to the switch SW1 that short-circuits the resistor R1 and the capacitor C1, and the on/off of the switch SW1 is controlled by the inverted selection signal SEL_Vea_b. The inverted selection signal SEL_Vea_b is a signal obtained by inverting a selection signal SEL_Vea for selecting the output signal Vea by an inverter INV (INV1 to INV3).

The reference value Vref (Vref1, Vref2, and Vref3) is input to the positive input end of the error amplifier EA, and thus the error amplifier EA operates so that the detection signal V matches the reference value Vref. In other words, a feedback loop using the error amplifier EA is formed for the detection signal V. Besides, by the resistors R1 and R2 and the capacitors C1 and C2, a phase compensation is executed, and the feedback loop is prevented from oscillating or the like.

FIG. 2B is a diagram showing the configurations of the three error amplifiers EA1 to EA3 and the multiplexer 12. Here, the three error amplifiers EA1 to EA3 have essentially the same configuration. In other words, the three error amplifiers EA1 to EA3 respectively receive the three detection signals V1 to V3 and the three selection signals SEL_Vea1 to SEL_Vea3, and respectively output the three output signals Vea1 to Vea3.

The resistors R11 and R21, the capacitors C11 and C21, the switches SW11 and SW21, and the inverter INV1 of the error amplifier EA1, the resistors R12 and R22, the capacitors C12 and C22, the switches SW12 and SW22, and the inverter INV2 of the error amplifier EA2, and the resistors R13 and R23, the capacitors C13 and C23, the switches SW13 and SW23, and the inverter INV3 of the error amplifier EA3 respectively correspond to each other.

In the multiplexer 12, the output signals Vea1 to Vea3, which are the outputs of the respective error amplifiers EA1 to EA3, are respectively output via the three switches SW21, SW22, and SW23 inside the multiplexer 12. The selection signals SEL_Vea1 to SEL_Vea3 from the controller 20 are supplied to the multiplexer 12, and any one of the three switches SW21, SW22, and SW23 is turned on by the selection signals SEL_Vea1 to SEL_Vea3, and thereby one of the output signals Vea1 to Vea3 from the corresponding error amplifiers EA1 to EA3 is selected and output as the output signal Vea*.

In addition, the selection signals SEL_Vea1 to SEL_Vea3 are supplied to the switches SW11, SW12, and SW13 of the respective error amplifiers EA1 to EA3 as the inverted selection signals SEL_Vea1_b to SEL_Vea3_b via the inverters INV1 to INV3.

Accordingly, in a case that one of the three switches SW21, SW22, and SW23 turns on, the corresponding one of the three switches SW11, SW12, and SW13 turns on, and the other two switches of the switches SW11, SW12, and SW13 turn off. In this way, in a case that one of the output signals Vea is selected, in the error amplifier EA in which the output signal is selected, the detection signal V supplied thereto is input via the resistor R1 and the capacitor C1, and in the error amplifier EA in which the output signal Vea is not selected, the detection signal V is directly input to the amplifier Amp.

In this way, by short-circuiting the resistors R11, R12, and R13 for phase compensation in the loop that is not selected, the bandwidths of the error amplifiers EA1 to EA3 are widened, and the response can be speeded up.

Furthermore, in a case that there is a phase compensation RC inside each of the error amplifiers EA1 to EA3, a fast response can also be achieved by disconnecting this RC when the loop is not selected.

Note that in the feedback loop that is not selected, the input detection signal V is not subjected to feedback control and thus rarely matches Vref, and the output signal Vea of the error amplifier EA reaches near an upper limit or a lower limit of the output range.

Description of Operation

Figure 3:
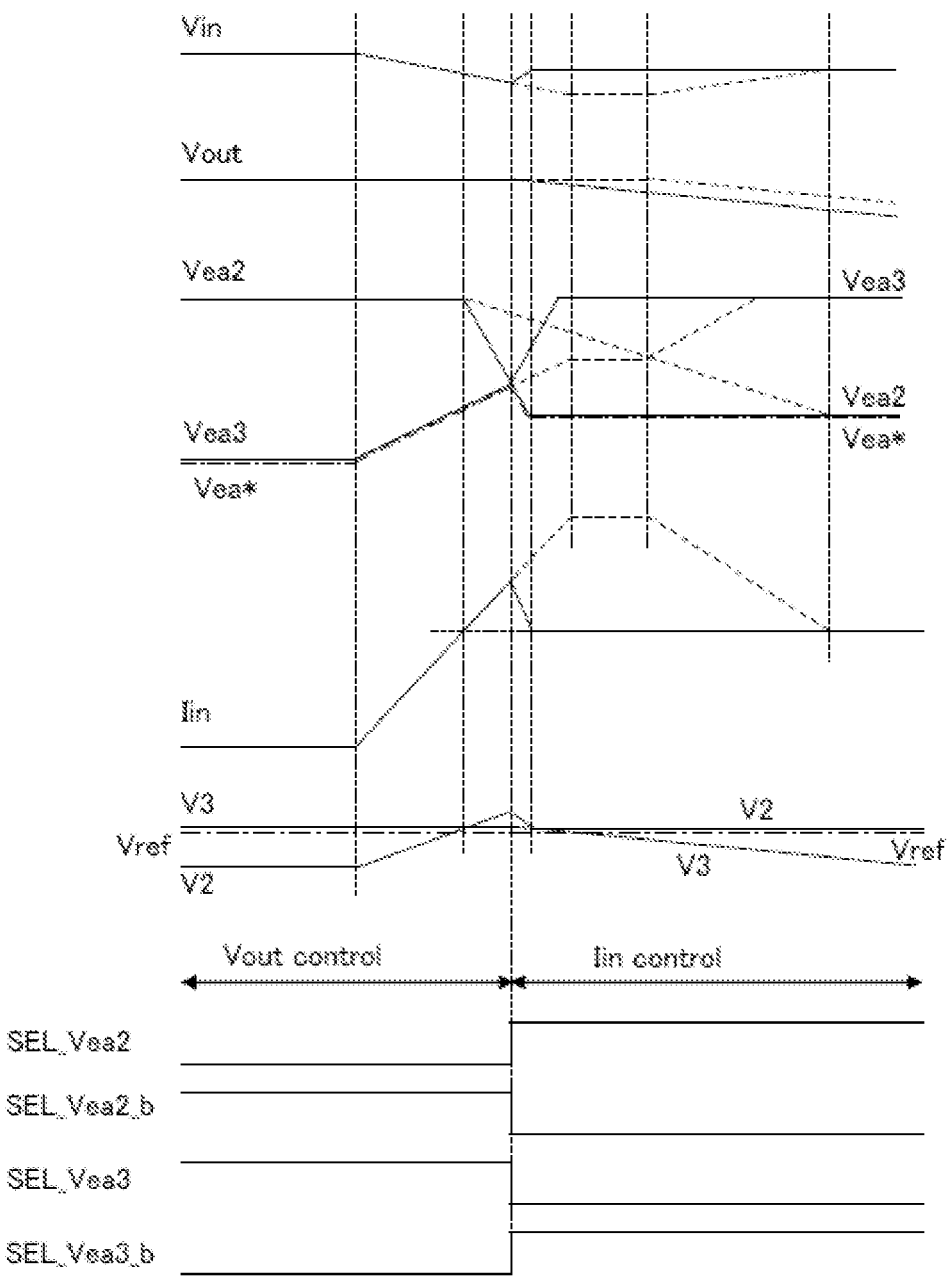
FIG. 3 is a timing chart showing operations of a circuit shown in FIG. 2B.

FIG. 3 is a timing chart showing operations of a circuit shown in FIG. 2B. A case is shown, in which the output signal Vea2 that controls the current Iin is selected (the switch SW22 turns on) from a state where the output signal Vea3 that controls the voltage Vout is selected (the switch SW23 turns on).

In this example, the input current Iin rises greatly in a state where the output voltage Vout is almost constant. In addition, in this example, it is assumed that the reference values Vref1 to Vref3 are the same (Vref=Vref1=Vref2=Vref3).

The output signal Vea2 is not selected as the feedback loop, the detection signal V2 and the reference value Vref2 do not match, and the output signal Vea2 sticks to an upper limit value based on this comparison result.

On the other hand, the output signal Vea3 is selected, and thus the output signal Vea3 is controlled to a predetermined value according to the voltage Vout. In FIG. 3, there is no change in the voltage Vout, and the error amplifier EA3 controls the output signal Vea3 so that the detection signal V3 matches the Vref3, and thus the output signal Vea3 is also maintained at an almost constant value.

In this state, the current Iin begins to rise. Thereby, in the error amplifier EA2, the input detection signal V2 (corresponding to the current Iin) rises. Here, because the error amplifier EA2 is not selected as the feedback loop, the switch SW12 turns on, and the output signal Vea2 is lowered quickly in response to the change in the detection signal V2. The detection signal V3 is controlled to match the Vref3 because the feedback loop is still functioning. On the other hand, in a state where the current Iin is increased, the output signal Vea3 rises in order to stop the voltage Vout from attempting to drop and maintain the voltage Vout at a predetermined value. In addition, because the current Iin increases, the voltage Vin decreases.

Besides, in a state where the output signal Vea2 of the error amplifier EA2 exceeds the output signal Vea3 of the error amplifier EA3, the signal SEL_Vea3 turns off, the signal SEL_Vea2 turns on, and the feedback loop to be selected shifts from the error amplifier EA3 to the error amplifier EA2.

Thereby, the detection signal V2 is controlled to match the reference value Vref, and the output signal Vea2 is controlled to a value that maintains the current Iin at a predetermined value. Accordingly, the current Iin is lowered and maintained at the predetermined value once the current Iin exceeds the predetermined value. In addition, the output signal Vea3 sticks to an upper limit value by getting out of the loop.

Here, in FIG. 3, a case that the switch SW12 is not arranged is shown by the broken line. In this way, the descent of the output signal Vea2 of the loop that is not selected is delayed due to limitation on the current of the resistor R12 and the like, and a delay time is generated before the output signal Vea2 is controlled to a predetermined value. In addition, due to the control delay, the increase in the current Iin to be controlled also can not be suppressed and a large overshoot occurs. Even if the output signal Vea3 is disconnected from the loop, the rise of the output signal Vea3 is delayed due to the delay caused by the resistor R13 and the influence of the overshoot of the current Iin.

Furthermore, the voltage Vin becomes low due to the influence of the overshoot of the current Iin, which takes time to recover. The voltage Vout is maintained at a predetermined value during a period that the loop is selected.

In this way, in a case that the current Iin rises in a state where the switch SW23 connected to the error amplifier EA3 turns on and the loop of the output signal Vea3 is selected, when the switch SW12 of the error amplifier EA2 turns off, a charging current of the capacitor C12 is determined by (V2−Vref2)/R12, and thus the capacitor C22 cannot be rapidly charged when the value of the resistor R12 is large. In the embodiment, in the error amplifier EA2 of the non-selected loop, the resistor R12 is brought into a short-circuit state by the switch SW1. The resistance value of the switch SW12 is much smaller than the resistance value of the resistor R12, and thus the charging current of the capacitor C22 can be increased. Accordingly, in a stage before the loop to be selected is switched, it is possible to follow the change in a control object in a loop to be selected next, and a fast response can be obtained. Besides, in a case that the loop is selected, the switch SW11 turns off and the resistor R11 comes into a non-short-circuit state, which makes it possible to perform control as usual.

Note that there is a method in which a clamping circuit is added so that the output voltage of the error amplifier does not rise, and for this reason, an amplifier that outputs an accurate clamping voltage is necessary. In the embodiment, the added switch can be controlled by simply using the selection signal, which makes it possible to simplify the configuration.

DESCRIPTION OF THE REFERENCE NUMERALS

10: output end
12: multiplexer
14: modulator
16: pre-driver
20: controller

What is claimed is:

1. An error amplifier circuit, comprising:
    a plurality of error amplifiers, each of which obtains an output for an error between two input signals; and
    a multiplexer, which selects or deselects the outputs of the plurality of error amplifiers and outputs the selected output of the error amplifier as a control signal for a circuit to be controlled;
    wherein
    regarding the multiplexer, in an error amplifier which is one of the plurality of error amplifiers and of which the output is not selected, a delay element arranged in an input path of the one error amplifier is short-circuited to widen the bandwidth of the error amplifier.

2. The error amplifier circuit according to claim 1, wherein
    the delay element is a resistor.

3. The error amplifier circuit according to claim 1, wherein
    one of the two input signals is a detection signal indicating operations of the circuit to be controlled, and the other of the two input signals is a reference value for the detection signal.

4. The error amplifier circuit according to claim 1, which controls whether or not to short-circuit the delay element by a selection signal in the multiplexer, the selection signal selects one of the plurality of error amplifiers.

5. The error amplifier circuit according to claim 4, which delays the selection signal, selects the output of the error amplifier, and then shifts the delay element from a short-circuit state to a non-short-circuit state.

\* \* \* \* \*